United States Patent
Tai et al.

(10) Patent No.: US 7,618,718 B2
(45) Date of Patent: Nov. 17, 2009

(54) LIGHT-EMITTING MATERIAL AND ORGANIC ELECTROLUMINESCENT DEVICE USING THE SAME

(75) Inventors: Chia-Liang Tai, Hsinchu (TW); Chen-Ping Yu, Longtan Township, Taoyuan County (TW); Ying-Ju Su, Taichung (TW)

(73) Assignee: AU Optronics Corp., Hsinchu (TW)

( * ) Notice: Subject to any disclaimer, the term of this patent is extended or adjusted under 35 U.S.C. 154(b) by 450 days.

(21) Appl. No.: 11/220,864

(22) Filed: Sep. 7, 2005

(65) Prior Publication Data

US 2006/0240283 A1   Oct. 26, 2006

(30) Foreign Application Priority Data

Apr. 21, 2005   (TW) .............................. 94112789 A (51) Int. Cl.
  *C09K 11/06* (2006.01)
  *H01L 51/54* (2006.01)
(52) U.S. Cl. ...................... 428/690; 428/917; 313/504; 313/506; 585/27; 548/440; 549/43; 549/460; 562/899
(58) Field of Classification Search ............. 585/24–27; 428/690, 917; 427/58, 66; 313/502–509; 257/40, 88–103, E51.001–E51.052; 252/301.16–301.35; 548/440; 549/43, 460; 562/899
See application file for complete search history.

(56) References Cited

U.S. PATENT DOCUMENTS 5,142,343 A    8/1992   Hosokawa et al. ............. 357/17
5,416,213 A    5/1995   Hasegawa et al. ........... 544/405

(Continued)

FOREIGN PATENT DOCUMENTS

EP           1061112 A1    12/2000

(Continued)

*Primary Examiner*—D. Lawrence Tarazano
*Assistant Examiner*—Camie S Thompson
(74) *Attorney, Agent, or Firm*—Thomas, Kayden, Horstemeyer & Risley

(57) ABSTRACT

A light-emitting material is represented by the following general formula [1]:

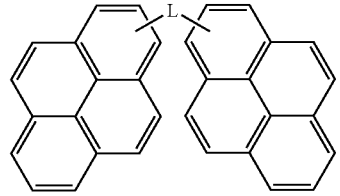

[1]

useful as an emissive layer of organic electroluminescent device (OELD). The chemical structure L is selected from a group consisting of the chemical structures AA, BB, AB, and the combination thereof. The chemical structures A and B are respectively represented by the following general formulas [2] and [3]:

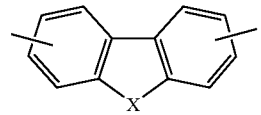

[2]

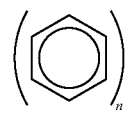

[3]

The chemical structure X is selected from the group 4A to 6A elements of the periodic table. The chemical structure B is an aromatic hydrocarbon having n benzenes, wherein n is an integer of 1 to 8.

20 Claims, 2 Drawing Sheets

U.S. PATENT DOCUMENTS

| | | | |
|---|---|---|---|
| 5,443,921 A | 8/1995 | Hosokawa et al. | 428/690 |
| 6,531,234 B1 | 3/2003 | Higashi et al. | 428/690 |
| 6,534,199 B1 | 3/2003 | Hosokawa et al. | 428/690 |
| 6,635,364 B1 * | 10/2003 | Igarashi | 428/690 |
| 6,713,192 B2 | 3/2004 | Fukuoka et al. | 428/690 |
| 6,730,416 B1 | 5/2004 | Chondroudis et al. | 428/690 |
| 6,852,429 B1 | 2/2005 | Li et al. | |
| 2003/0186081 A1 | 10/2003 | Sotoyama et al. | 428/690 |
| 2004/0053069 A1 | 3/2004 | Sotoyama et al. | 428/690 |
| 2004/0137270 A1 | 7/2004 | Seo et al. | 428/690 |

FOREIGN PATENT DOCUMENTS

| | | |
|---|---|---|
| EP | 1167488 A1 | 1/2002 |
| EP | 1191822 A1 | 3/2002 |
| EP | 1381639 | 1/2004 |
| EP | 1403354 A1 | 3/2004 |
| EP | 0934992 B1 | 7/2004 |
| WO | WO 2004/020372 * | 3/2004 |

* cited by examiner

LIGHT-EMITTING MATERIAL AND ORGANIC ELECTROLUMINESCENT DEVICE USING THE SAME

This application claims the benefit of Taiwan application Serial No. 94112789, filed Apr. 21, 2005, the subject matter of which is incorporated herein by reference.

BACKGROUND OF THE INVENTION

1. Field of the Invention

The present invention relates in general to a light-emitting material and an organic electroluminescent device using the same and, more particularly, to a light-emitting material including two pyrenes bonded together via different link rings and an organic electroluminescent device using the same.

2. Description of the Related Art

A conventional organic electroluminescent device (OELD) is a multi-layer stacked structure including a substrate, an anode, a cathode, a hole injection layer, a hole transport layer, an electron transport layer, an electron injection layer and an emissive layer. The anode, the hole injection layer, the hole transport layer, the emissive layer, the electron transport layer, the electron injection layer and the cathode are disposed on the substrate orderly from bottom to top. The emissive layer includes a host-dopant system, in which a few dopants are doped in host material. The way to define a fluorescent host-dopant system and a phosphorescent host-dopant system are illustrated as follows.

When a voltage is applied to the cathode and the anode, electrons are injected into the emissive layer from the cathode through the electron injection layer and the electron transport layer. Holes are injected into the emissive layer from the anode through the hole injection layer and the hole transport layer. After the electrons and the holes combine in the emissive layer, the host material is excited from a ground state to an excited state. Because the host material in the excited state is unstable, the host material certainly returns to the ground state and transfer energy to the dopants.

When the dopants receive the energy and are excited from the ground state to the excited state, singlet excitons and triplet excitons are generated by the dopants. In both the fluorescent dopants and the phosphorescent dopants, due to the distribution ratio of the electron spin state, the probability of forming the triplet excitons and the singlet excitons is approximately 3:1.

Electroluminescence occurs in the organic electroluminescent device while the singlet excitons or the triplet excitons return to the ground state by releasing photons. In the fluorescent host-dopant system, only the singlet excitons emit visible fluorescence when returning to the ground state. In the phosphorescent host-dopant system, when returning to the ground state, the triplet excitons emit visible phosphorescence and the singlet excitons emit light which can be transferred to phosphorescence through internal system crossing (ISC).

The conventional emissive layer includes pyrenes. The pyrenes are planar structures, easily resulting in $\pi$-$\pi$ stacking among the pyrenes. As a result, the light color and the luminance efficiency of the organic electroluminescent device using pyrenes are affected seriously. Therefore, aryl group and t-butyl group are mostly induced in the conventional emissive materials, for acting as substituted group of pyrenes. Accordingly, the chemical structure of pyrenes having substituted group is three-dimensional, so as to decrease the effect of $\pi$-$\pi$ stacking on the light color. Although the three-dimensional properties of pyrenes become better due to the existence of substituted groups, the substituted groups beside pyrenes lower the light color and the luminance efficiency of the organic electroluminescent device using pyrenes with the substituted groups.

SUMMARY OF THE INVENTION

It is therefore an object of the present invention to provide a light-emitting material and an organic electroluminescent device using the same. The emissive layer including two pyrenes bonded together via different link rings can improve the three-dimensional properties of the light-emitting material. The limitations of the conventional design using pyrenes with substituted groups to improve the three-dimensional properties of pyrenes can be avoided. Therefore, the present invention not only can decrease the effect of $\pi$-$\pi$ stacking on the light color but also can avoid the decline of light color and the poor luminance efficiency in the conventional organic electroluminescent device using pyrenes with substituted groups. The light color and the luminance efficiency of the organic electroluminescent device using the light-emitting material of the present invention are much better than those of the conventional organic electroluminescent device including pyrenes with substituted groups. Moreover, the light-emitting material of the present invention has good thermal stability and luminance efficiency. The wavelength of the light emitted from the light-emitting material of the present invention inclines to that of blue light. As a result, the light-emitting material of the present invention is very suitable for blue light-emitting material or light-emitting material in another color.

The present invention achieves the above-identified objects by providing a light-emitting material. The chemical structure of the light-emitting material is represented by the following general formula [1]:

[1]

The chemical structure L is selected from the chemical structures AA, BB, AB, and the combination thereof. The chemical structure "A" is represented by the following general formula [2]:

[2]

The chemical structure X is selected from the groups 4A to 6A elements of the periodic table.

The chemical structure B is an aromatic hydrocarbon having n benzenes, and n is an integer of 1 to 8. The chemical structure B is represented by the following general formula [3]:

[3]

The present invention achieves the above-identified objects by providing an organic electroluminescent device including a substrate, an anode, a cathode, a hole transport layer, an electron transport layer and an emissive layer. The anode and the cathode opposite to the anode are disposed over the substrate. The hole transport layer is disposed between the anode and the cathode. The electron transport layer is disposed between the cathode and the hole transport layer. The emissive layer is disposed between the hole transport layer and the electron transport layer. The emissive layer includes a light-emitting material. Two pyrenes are bonded together via a chemical structure L to form the light-emitting material. The chemical structure of the light-emitting material is represented by the following general formula [1]:

[1]

The chemical structure L is selected from the group consisting of the chemical structures AA, BB, AB and the combination thereof. The chemical structure A is represented by the following general formula [2]:

[2]

The chemical structure X is selected from the groups 4A to 6A elements of the periodic table.

The chemical structure B is an aromatic hydrocarbon having n benzenes, and n is an integer of 1 to 8. The chemical structure B is represented by the following general formula [3]:

[3]

Other objects, features, and advantages of the present invention will become apparent from the following detailed description of the preferred but non-limiting embodiments. The following description is made with reference to the accompanying drawings.

DETAILED DESCRIPTION OF THE INVENTION

First Embodiment

A light-emitting material is provided in the present embodiment of the invention. Two pyrenes are bonded together via a different link ring L to form the light-emitting material, for improving the three-dimensional properties of the pyrenes. This design is totally different from the conventional design using pyrenes doped with substituted groups to improve the three-dimensional properties of the pyrenes. The main chemical structure of the light-emitting material of the present embodiment of the invention is represented by the following general formula [1]:

[1]

The chemical structure L defines the structure of the link ring for bonding the two pyrenes. The chemical structure L includes the chemical structure A and the chemical structure B. The chemical structure L can be selected from the group consisting of the chemical structures AA, BB, AB, and the combination thereof. The chemical structures A and B are illustrated in details as follows. The chemical structure A is represented by the following general formula [2]:

[2]

The chemical structure X is selected from the groups 4A to 6A elements of the periodic table.

The chemical structure B is an aromatic hydrocarbon having n benzenes, and n is an integer of 1 to 8. The chemical structure B is represented by the following general formula [3]:

[3]

In the present embodiment of the invention, the chemical structure X could be carbon, oxygen, sulfur, nitrogen, or selenium. According to an embodiment, the chemical structures X and B each could further include a substituted group For example, the chemical structure X includes a substituting group selected from the group consisting of alkyl, alkoxy, alkylsilyl, aryl, heteroaryl, aryloxy, arylamino, arylsilyl, hydrogen, and any other substituted groups. The chemical structure B includes a substituted group selected from the group consisting of alkyl, alkoxy, alkylsilyl, aryl, aryloxy, arylamino, arylsilyl, heteroaryl, hydrogen, and any other substituted groups.

Furthermore, according to another embodiment, the chemical structure X could further include a first and a second substituted groups, and the chemical structure B could further include a substituted group. For examples, the first and the second substituted groups of chemical structure X are independently selected from the group consisting of alkyl, alkoxy, alkylsilyl, aryl, heteroaryl, aryloxy, arylamino, arylsilyl, hydrogen, and any other substituents. The substituted group of chemical structure B is selected from the group consisting of alkyl, alkoxy, alkylsilyl, aryl, aryloxy, arylamino, arylsilyl, heteroaryl, hydrogen, and any other substituted groups.

When the chemical structure X is carbon, the chemical structure A is represented by the formula [IV]:

[IV]

When the chemical structure X is nitrogen, the chemical structure A is represented by the formula [V]:

[V]

The chemical structure B is selected from the group consisting of benzene, naphthalene, anthracene, phenanthrene, and biphenyl. The formulas of benzene, naphthalene, anthracene, phenanthrene and biphenyl are illustrated as follows:

benzene　　naphthalene　　anthracene phenanthrene　　biphenyl

According to the present invention, the chemical structure L is illustrated as modes AA, AB, BB, and the combination thereof. First, when the chemical structure L is mode AA, examples of "AA" compounds are shown as follows:

-continued

Moreover, when the chemical structure L is mode BB, examples of "BB" compounds are shown as follows:

Furthermore, when the chemical structure L is mode AB, examples of "AB" compounds are shown as follows:

In the present embodiment of the invention, the light-emitting material formed by two pyrenes bonded together via the chemical structure L can be selected from the group consisting Dipyrenes fluorenyl anthracene (DPFA), Dipyrenes carbazoly anthracene (DPCA), Dipyrenes phenyl benzene (DPPB) and the combination thereof. The formulas thereof are shown as follows:

DPFA

DPCA

DPPB

In DPFA and DPCA, the chemical structure L is mode AB described above. In DPPB, the chemical structure L is the mode BB described above.

The manufacture of DPFA is illustrated first as an example of the manufacture of the light-emitting materials revealed in the present embodiment of the invention.

In the process of manufacturing DPFA, first, in step (a), 9-(9,9-Diethyl-9H-fluoren-2-yl)-anthracene shown as compound 3 is synthesized. Synthesis of compound 3 is shown as follows:

In step (a), first, about 1.9 g (8.5 mmol) of compound 1, about 2 g (7.5 mmol) of compound 2, about 260 mg (0.23 mmol) of Tetrakis(triphenylphosphine)palladium[Pd $(PPh_3)_4$,], and about 2 M, 7.5 ml of $K_2CO_3$ solution (7.5 mmol $K_2CO_3$) are added into a bottle containing 20 ml of ethanol (EtOH) and 10 ml of Dimethoxyethane (DME). The volume ratio of EtOH and DME is about 2:1. The mixed solution is stirred and heated. Next, entire reactants boil and react until the next day. Afterwards, the compound 1 is traced by thin layer chromatography (TLC) to confirm whether the entire compound 1 reacts completely. Then, products of the pre-mentioned synthesizing formula remain at a high temperature, and impurities of the products are filtered out by a glass filtering plate. Lastly, the filtered solution is re-crystallized in ethanol to obtain the compound 3 with high purity. The com- pound 3 obtained in step (a) weights about 3 g and its weight percentage is about 60%. The purity of the compound 3 is respectably high.

After the compound 3 is synthesized, (9-Bromo-10-(7-bromo-9,9-diethyl-9H-fluoren-2-yl)-anthracene shown as compound 4 is synthesized in step (b). Synthesis of compound 4 is shown as follows:

In step (b), in the condition of ice-bath, about 1.9 g (10.5 mmol) of N-bromosuccinimide (NBS) is added into a bottle containing about 2 g (5 mmol) of compound 3 and 10 ml of Dimethylformamide (DMF). Reactants remain at a room temperature (r.t.) and react until the next day. Then, on the next day, 40 ml of saturated $Na_2S_2O_4$ solution is added. And 40 ml of ethyl acetate is added for extraction. Afterwards, the mixed solution is dried out through condensation at reducing pressure. Next, the precipitates are washed by deionized water (DIW) and n-hexane, as to obtain the compound 4 with high purity. The compound 4 obtained in step (b) weights about 1.9 g and its weight percentage is about 70%. The purity of the compound 4 is respectably high.

Finally, DPFA is synthesized in step (c). Synthesis of compound DPFA is shown as follows.

In step (c), first, about 1.9 g (3.4 mmol) of compound 4, about 1.7 g (6.8 mmol) of compound 5, about 231 mg (0.2 mmol) of $Pd(PPh_3)_4$ and 2M, 6.8 ml of $K_2CO_3$ solution (13.6 mmol $K_2CO_3$) are added in a bottle containing about 20 ml of EtOH and about 10 ml of DME. The volume ratio of EtOH and DME is about 2:1. The mixed solution is stirred and heated. Next, reactants boil and react until the next day. Afterwards, the compound 4 is traced by TLC to confirm whether the entire compound 4 reacts completely. Due to the poor solubility, the products can not be re-crystallized in EtOH. Therefore, after washed by DIW, the precipitates are directly purified through sublimation to obtain the compound of DPFA. The obtained compound of DPFA weights about 814 mg, and its weight percentage is about 30%.

The manufacture and the synthesizing process of DPCA are described as follows:

-continued

DPCA

DPPB

In the process of manufacturing DPCA, first, compound 6 is synthesized. Then, compound 7 is synthesized. Lastly, DPCA is synthesized.

In the process of synthesizing compound 6, compound 1, compound 9, Pd(PPh$_3$)$_4$ and K$_2$CO$_3$ solution are added in a bottle containing EtOH and DME. The volume ratio of EtOH and DME is about 2:1. The mixed solution is stirred and heated. Then, reactants boil and react until the next day. Afterwards, the compound 1 is traced by TLC to confirm whether the entire compound 1 reacts completely. Next, products of the pre-mentioned synthesizing formula are remained at a high temperature and are filtered by a glass filtering plate to filter out impurities. Lastly, the filtered solution is re-crystallized in EtOH to obtain the compound 6 with high purity.

In the process of synthesizing the compound 7, first, in the condition of ice-bath, NBS is added in a bottle containing the compound 6 and DMF. Next, reactants react at a room temperature (r.t.) until the next day. Then, on the next day, saturated Na$_2$S$_2$O$_4$ solution is added into the bottle. And ethyl acetate is added for extraction. Afterwards, solvent is dried out through condensation at decreasing pressure. Next, the precipitates are washed by DIW and n-hexane to obtain the compound 7 with high purity.

In the process of synthesizing the compound DPCA, first, the compound 7, the compound 5, Pd(PPh$_3$)$_4$ and K$_2$CO$_3$ solution are added in a bottle containing EtOH and DME. The volume ratio of EtOH and DME is about 2:1. The mixed solution is stirred and heated. Next, reactants boil and react until the next day. Afterwards, the compound 7 is traced by TLC to confirm that the entire compound 7 reacts completely. Products in the pre-mentioned formula can not be re-crystallized in EtOH due to poor solubility. Therefore, the precipitates are washed cleaned by DIW and then directly purified through sublimation to obtain the compound of DPCA.

The manufacture and synthesizing process of DPPB are illustrated as follows:

In the process of synthesizing DPPB, first, compound 8, the compound 5, Pd(PPh$_3$)$_4$ and K$_2$CO$_3$ solution are added in a bottle containing EtOH and DME. The volume ratio of EtOH and DME is about 2:1. The mixed solution is stirred and heated. Next, reactants boil and react until the next day. Then, the compound 8 is traced by TLC to confirm that the entire compound 8 reacts completely. Products of the pre-mentioned formula can not be re-crystallized in EtOH due to poor solubility. Therefore, the precipitates are washed by DIW and then directly purified through sublimation to obtain the compound DPPB.

Figure 1:
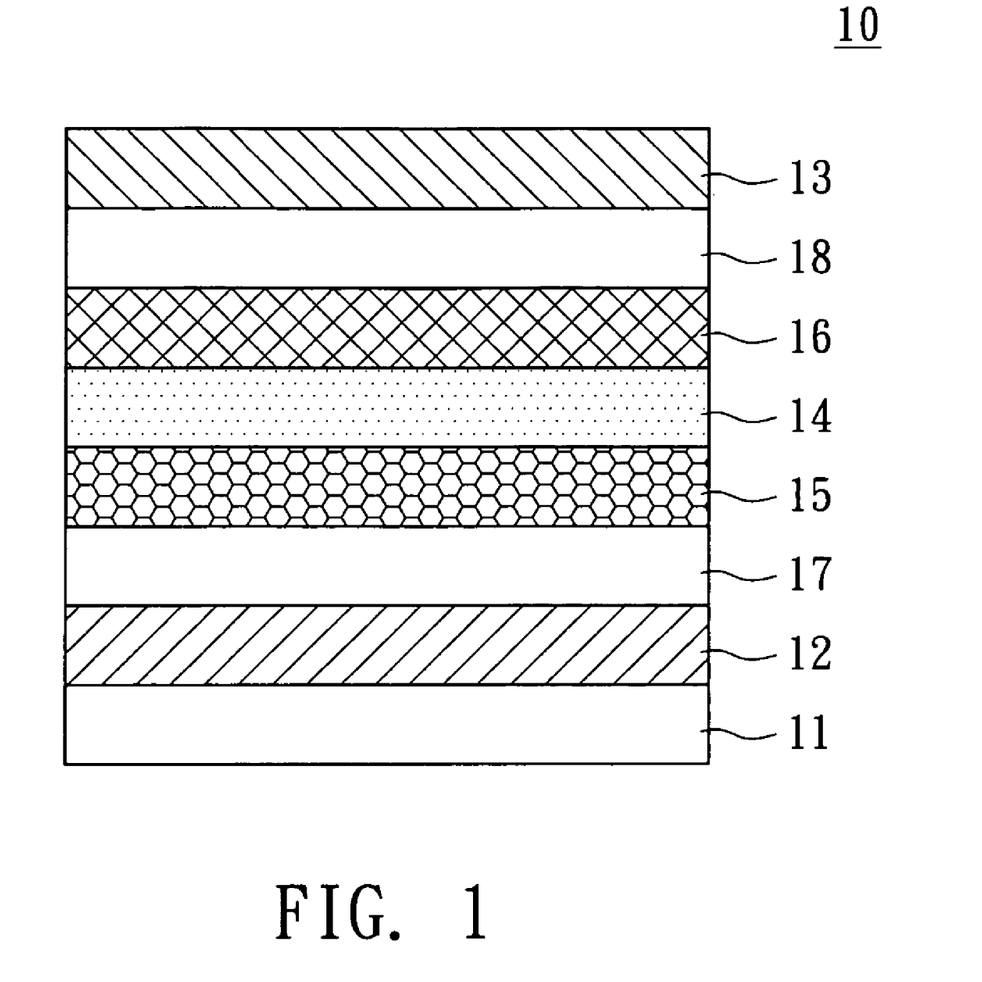
FIG. 1 illustrates a cross-sectional view of an organic electroluminescent device according to the first embodiment using the light-emitting materials of the present invention.

Referring to FIG. 1, a cross-sectional view of an organic electroluminescent device according to the first embodiment using the light-emitting materials of the present invention is illustrated. The electroluminescent device can be organic light emitting diode (OLED) or polymer light emitting diode (PLED). In the present embodiment of the invention, an OLED is illustrated as an example. However, the skills revealed in the present embodiment of the invention can be applied to PLED as well.

In FIG. 1, the electroluminescent device 10 includes at least a substrate 11, an anode 12, a cathode 13, an emissive layer 14, a hole transport layer 15 and an electron transport layer 16. The anode 12 and the cathode 13 opposite to the anode 12 are disposed over the substrate 11. The hole transport layer 15 is disposed between the anode 12 and the cathode 13. The electron transport layer 16 is disposed between the cathode 13 and the hole transport layer 15. The emissive layer 14 is disposed between the hole transport layer 15 and the electron transport layer 16 and includes the pre-mentioned light-emitting materials, such as DPFA, DPCA, DPPB and the combination thereof. Moreover, the organic electroluminescent device 10 further includes a hole injection layer 17 and an electron injection layer 18. The hole injection layer 17 is disposed between the hole transport layer 15 and the anode 12. The electron injection layer 18 is disposed between the electron transport layer 16 and the cathode 13.

When the light-emitting materials of the present embodiment of the invention act as host materials, dopants can be doped in the emissive layer of the present embodiment of the invention to form a host-dopant system. The electroluminescent device, such as a fluorescent electroluminescent device or a phosphorescent device, can be built. When the light-emitting materials of the present embodiment of the invention act as dopants, the light-emitting materials of the present embodiment of the invention can be doped in host material in the emissive layer to form a host-dopant system as well. The electroluminescent device, such as a phosphorescent device or a fluorescent device, can be built. Therefore, the light-emitting materials revealed in the present embodiment of the invention can be applied widely and not limited to the above field.

However, anyone who has ordinary skills in the field of the present embodiment of the invention can understand that the invention is not limited thereto. For example, the anode 12 and the cathode 13 can be metals, alloys or transparent and electrically conductive materials. And one of the anode 12 and the cathode 13 is a transparent electrode or a translucent electrode. Examples of the pre-mentioned transparent and electrically conductive material include indium tin oxide (ITO), indium zinc oxide (IZO), cadmium tin oxide (CTO), stannim dioxide ($SnO_2$) zinc oxide (ZnO) and other similar transparent metal oxides. Examples of the pre-mentioned metals and alloys include aurum (Au), aluminum (Al), indium (In), magnesium (Mg) and calcium (Ca).

When only the anode 12 is transparent or translucent, the cathode 13 can be a reflective metal. Then, the organic electroluminescent device 10 is a bottom emission device, and the substrate 11 must be a transparent or a translucent substrate. When only the cathode 13 is transparent or translucent, the anode 12 can be a reflective metal. Then the organic electroluminescent device 10 is a top emission device, and the substrate 11 can be a transparent, a translucent or an opaque substrate. When both the anode 12 and the cathode 13 are transparent or translucent, the electroluminescent device 10 is a dual emission device, and the substrate 11 must be a transparent or a translucent substrate.

In the present embodiment of the invention, manufacturing method of the organic electroluminescent device 10 includes following steps. First, the substrate 11 is provided. Then, the anode 12 is formed on the substrate 11. Afterwards, the hole injection layer 17 is formed on the anode 12. Next, the hole transport layer 15 is formed on the hole injection layer 17. Then, the emission layer 14 is formed on the hole transport layer 15. The emissive layer 14 includes the pre-mentioned light-emitting materials, such as DPFA, DPCA, DPPB and the combination thereof. Next, the electron transport layer 16 is formed on the emissive layer 14. Subsequently, the electron injection layer 18 is formed on the electron transport layer 16. Afterwards, the cathode 13 is form on the electron injection layer 18. Therefore, manufacture of the organic electroluminescent device 10 is completed.

Second Embodiment

Figure 2:
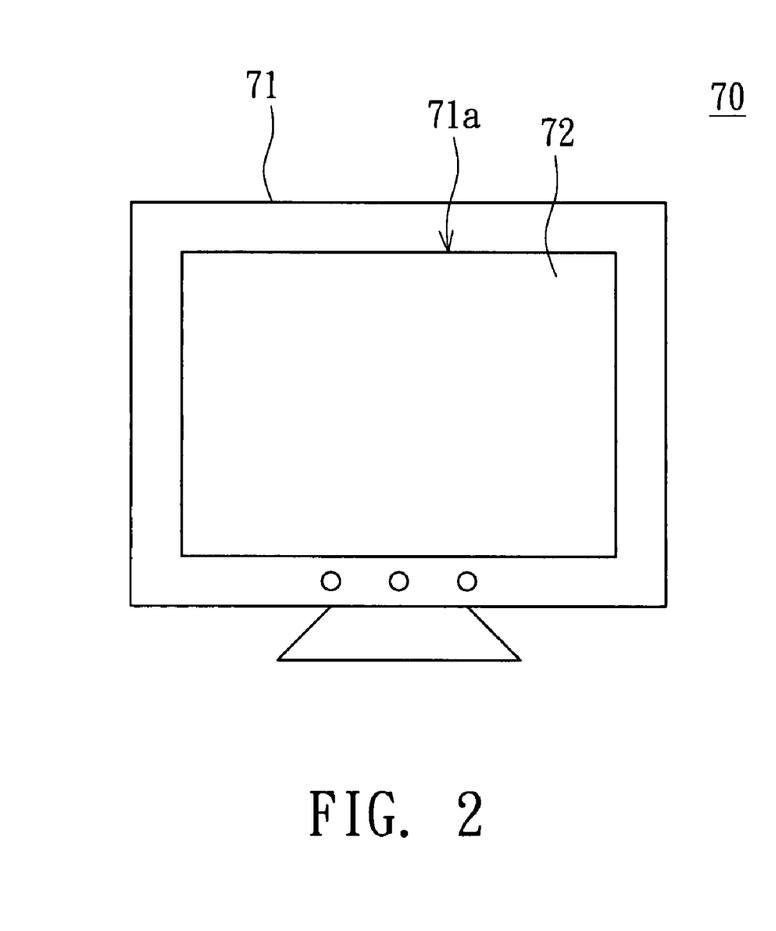
FIG. 2 illustrates a flat panel display apparatus according to the second embodiment using the organic electroluminescent device of the present invention.

Referring to FIG. 2, a flat panel display apparatus according to the second embodiment using the organic electroluminescent device of the present invention is illustrated. A flat panel display apparatus can be a flat panel display 70, such as a computer screen, a flat panel television or a monitor screen. In the present embodiment of the invention, the flat panel display 70 is a computer screen for example.

In FIG. 2, the flat panel display apparatus 70 includes a housing 71 and a display panel 72. The display panel 72 at least includes the pre-mentioned organic electroluminescent device 10 and is disposed on the housing 71. Moreover, a display area of the display panel 72 is exposed to the surroundings through a front opening 71a of the housing 71.

Third Embodiment

Figure 3:
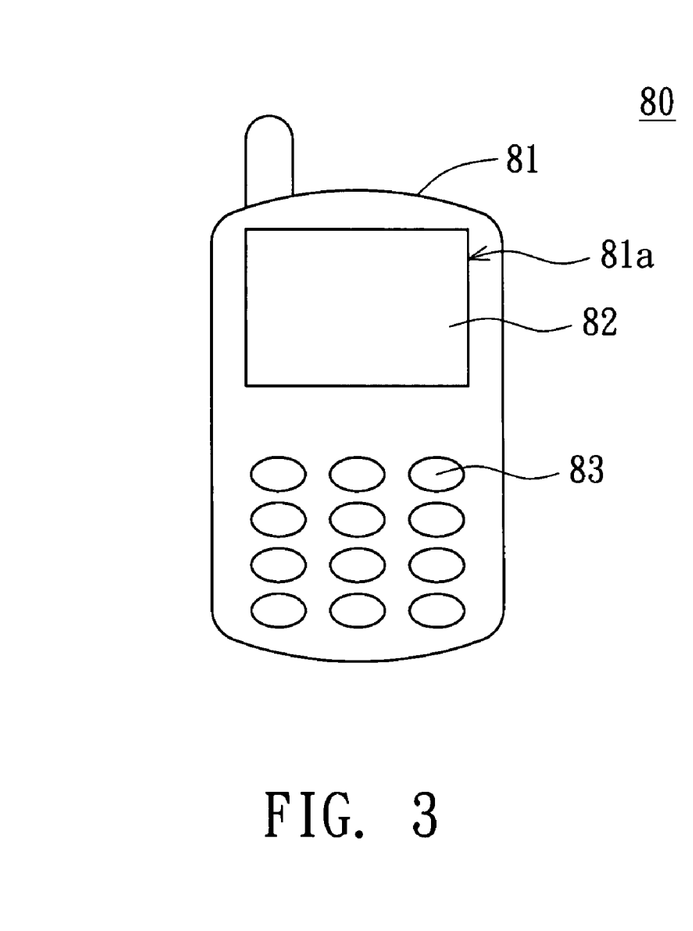
FIG. 3 illustrates a flat panel display apparatus according to the third embodiment using the organic electroluminescent device of the present invention.

Referring to FIG. 3, a flat panel display apparatus according to the third embodiment using the organic electroluminescent device of the present invention is illustrated. A flat panel display apparatus can be a portable display apparatus 80, such as a mobile phone, a hand-held video game, a digital camera (DC), a digital video (DV), a digital displayer, a personal digital assistant (PDA), a notebook, or a table PC. In the present embodiment of the invention, the portable display apparatus 80 is a mobile phone for example.

In FIG. 3, the portable display apparatus 80 includes a housing 81, a display panel 82 and a set of press buttons 83. The display panel 82 at least includes the pre-mentioned organic electroluminescent device 10 and is disposed on the housing 81. Moreover, a display area of the display panel 82 is exposed to the surroundings through a front opening 81a of the housing 81. The set of press buttons 83 is disposed on a front surface of the housing 81 and is positioned on a side of the display panel 82.

Furthermore, the organic electroluminescent device 10 of the present embodiment of the invention can be applied to any electric apparatus with display panels.

Two pyrenes are bonded together via different bonds in the light-emitting materials and the organic electroluminescent devices using the same described in the embodiments of the present invention. The three-dimensional properties of the materials can be improved. And the limitations of the conventional design using pyrenes with substituents to strengthen the three-dimensional properties of pyrenes can be avoided. Therefore, the embodiments of the present invention can lower the effect of light color due to $\pi$-$\pi$ stacking. Furthermore, the decline of light color and poor luminance efficiency in the conventional organic electroluminescent device using pyrenes with substituents can be avoided. The light color and the luminance efficiency of the electroluminescent device using the light-emitting materials of the embodiments of the present invention are much better than those of the conventional organic electroluminescent device using pyrenes with substituents. Moreover, the light-emitting materials synthesized in the embodiments of the present invention have good thermal stability and luminance efficiency. The wavelength of the light emitted thereof inclines to the wavelength of the blue light. Therefore, the light-emitting materials synthesized in the embodiments of the present invention are very suitable for blue light-emitting materials. Certainly, different colors of light with different wavelengths can be produced by different compounds. Therefore, the light-emitting materials of the present invention are very suitable for light-emitting materials in other colors as well.

While the present invention has been described by way of example and in terms of embodiments, it is to be understood that the present invention is not limited thereto. On the contrary, it is intended to cover various modifications and similar arrangements and procedures, and the scope of the appended claims therefore should be accorded the broadest interpretation so as to encompass all such modifications and similar arrangements and procedures.

We claim:

1. A light-emitting material represented by the following general formula [1]:

[1]

wherein L is selected from the group consisting of:
—A—A—, —B—B— and —A—B— wherein A is

[2]

and B is

[3]

wherein when L is —A—B—, X is selected from the group consisting of groups 4A to 6A elements of the periodic table and is substituted with at least one substituent independently selected from the group consisting of alkyl, alkoxy, alkylsilyl, aryl, heteroaryl, aryloxy, arylamino, arylsilyl, and hydrogen, and B is optionally substituted with a substituent selected from the group consisting of alkyl, alkoxy, alkylsilyl, aryl, aryloxy, arylamino, arylsilyl, heteroaryl, and hydrogen, and n is an integer of 1 to 8;

wherein when L is —B—B—, B is optionally substituted with a substituent selected from the group consisting of alkyl, alkoxy, alkylsilyl, aryl, aryloxy, arylamino, arylsilyl, heteroaryl, and hydrogen, and n of a first B is an integer of 1 to 8, and n of another B, other than the first B, is an integer of 2 to 8; and wherein when L is —A—A—, X of a first A is selected from the group consisting of group 4A to 6A elements of the periodic table except carbon, and X of a second A is selected from the group consisting of group 4A to 6A elements of the periodic table, and wherein X is substituted with at least one substituent selected from the group consisting of alkyl, alkoxy, alkylsilyl, aryl, heteroaryl, aryloxy, arylamino, arylsilyl, and hydrogen.

2. The light-emitting material of claim 1, wherein L is —A—B— and the X is substituted with a first substituent selected from the group consisting of alkyl, alkoxy, alkylsilyl, aryl, heteroaryl, aryloxy, arylamino, arylsilyl, and hydrogen.

3. The light-emitting material of claim 2, wherein X is selected from the group consisting of carbon, oxygen, sulfur, nitrogen, or selenium.

4. The light-emitting material of claim 3, wherein B is selected from the group consisting of benzene (n is 1), naphthalene (n is 2), anthracene (n is 3), phenanthrene (n is 3), and biphenyl (n is 2).

5. The light-emitting material of claim 1, wherein B is substituted with a substituent selected from the group consisting of alkyl, alkoxy, alkylsilyl, aryl, aryloxy, arylamino, arylsilyl, heteroaryl, and hydrogen.

6. The light-emitting material of claim 1, wherein chemical structure L is —A—B— and X is substituted with two substituents independently selected from the group consisting of alkyl, alkoxy, alkylsilyl, aryl, aryloxy, arylamino, arylsilyl, heteroaryl, and hydrogen.

7. The light-emitting material of claim 6, wherein X is selected from the group consisting of carbon, oxygen, sulfur, nitrogen, or selenium.

8. The light-emitting material of claim 7, wherein B is selected from the group consisting of benzene (n is 1), naphthalene (n is 2), anthracene (n is 3), phenanthrene (n is 3), and biphenyl (n is 2).

9. The light-emitting material of claim 8, wherein B is substituted with a substituent selected from the group consisting of alkyl, alkoxy, alkylsilyl, aryl, aryloxy, arylamino, arylsilyl, heteroaryl, and hydrogen.

10. An organic electroluminescent device (OELD), comprising:
a substrate;
an anode and a cathode opposite to the anode, disposed over the substrate;
a hole transport layer disposed between the anode and the cathode;
an electron transport layer disposed between the cathode and the hole transport layer; and
an emissive layer, disposed between the hole transport layer and the electron transport layer, comprising a light-emitting material, the chemical structure of the light-emitting material represented by the following general formula [1]:

[1]

wherein the chemical structure L is selected from the group consisting of: —A—A—, —B—B— and —A—B— wherein A is

[2]

and B

[3]

wherein when L is —A—B—, X is selected from the group consisting of groups 4A to 6A elements of the periodic table, and is substituted with at least one substituent independently selected from the group consisting of alkyl, alkoxy, alkylsilyl, aryl, heteroaryl, aryloxy, arylamino, arylsilyl, and hydrogen, and a first B is optionally substituted with a substituent selected from the group consisting of alkyl, alkoxy, alkylsilyl, aryl, aryloxy, arylamino, arylsilyl, heteroaryl, and hydrogen, and n is an integer of 1 to 8;

wherein when L is —B—B—, B is optionally substituted with a substituent selected from the group consisting of alkyl, alkoxy, alkylsilyl, aryl, aryloxy, arylamino, arylsilyl, heteroaryl, and hydrogen, and n of one B is an integer of 1 to 8, and n of another B, other than the first chemical structure B, is an integer of 2 to 8; and wherein when L is —A—A—, X of a first A is selected from the group consisting of group 4A to 6A elements of the periodic table except carbon, and X of a second A is selected from the group consisting of group 4A to 6A elements of the periodic table, and wherein X is substituted with at least one substituent independently selected from the group consisting of alkyl, alkoxy, alkylsilyl, aryl, heteroaryl, aryloxy, arylamino, arylsilyl, and hydrogen.

11. The OELD of claim 10, wherein L is —A—B— and X is substituted with a first substituent selected from the group consisting of alkyl, alkoxy, alkylsilyl, aryl, heteroaryl, aryloxy, arylamino, arylsilyl, and hydrogen.

12. The OELD of claim 11, wherein X is selected from the group consisting of carbon, oxygen, sulfur, nitrogen, or selenium.

13. The OELD of claim 12, wherein B is selected from the group consisting of benzene (n is 1), naphthalene (n is 2), anthracene (n is 3), phenanthrene (n is 3), and biphenyl (n is 2).

14. The OELD of claim 12, wherein B is substituted with a substituent selected from the group consisting of alkyl, alkoxy, alkylsilyl, aryl, aryloxy, arylamino, arylsilyl, heteroaryl, and hydrogen.

15. The OELD of claim 10, wherein L is —A—B— and X is substituted with two substituents independently selected from the group consisting of alkyl, alkoxy, alkylsilyl, aryl, aryloxy, arylamino, arylsilyl, heteroaryl, and hydrogen.

16. The OELD of claim 15, wherein X is selected from the group consisting of carbon, oxygen, sulfur, nitrogen, or selenium.

17. The OELD of claim 15, wherein B is selected from the group consisting of benzene (n is 1), naphthalene (n is 2), anthracene (n is 3), phenanthrene (n is 3), and biphenyl (n is 2).

18. The OELD of claim 16, wherein B is substituted with a substituent selected from the group consisting of alkyl, alkoxy, alkylsilyl, aryl, aryloxy, arylamino, arylsilyl, heteroaryl, and hydrogen.

19. The OELD of claim 11 further comprising:
an electron injection layer disposed between the cathode and the electron transport layer; and
a hole injection layer disposed between the anode and the hole transport layer.

20. A flat panel display apparatus, comprising the electroluminescent device of claim 10.

* * * * *